(12) United States Patent
Ishida et al.

(10) Patent No.: US 10,056,574 B2
(45) Date of Patent: Aug. 21, 2018

(54) ORGANIC EL DISPLAY DEVICE

(71) Applicant: SHARP KABUSHIKI KAISHA, Sakai, Osaka (JP)

(72) Inventors: Mamoru Ishida, Sakai (JP); Tetsuya Okamoto, Sakai (JP); Takeshi Hirase, Sakai (JP); Tohru Senoo, Sakai (JP); Tohru Sonoda, Sakai (JP); Daichi Nishikawa, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/552,029

(22) PCT Filed: Feb. 12, 2016

(86) PCT No.: PCT/JP2016/000746
§ 371 (c)(1),
(2) Date: Aug. 18, 2017

(87) PCT Pub. No.: WO2016/132721
PCT Pub. Date: Aug. 25, 2016

(65) Prior Publication Data
US 2018/0040849 A1 Feb. 8, 2018

(30) Foreign Application Priority Data

Feb. 19, 2015 (JP) .................... 2015-030963

(51) Int. Cl.
*H01L 51/52* (2006.01)
*H05B 33/04* (2006.01)
(Continued)

(52) U.S. Cl.
CPC ...... *H01L 51/5246* (2013.01); *H01L 27/1214* (2013.01); *H01L 27/1266* (2013.01);
(Continued)

(58) Field of Classification Search
CPC . H01L 51/5246; H01L 27/1266; H01L 51/56; H01L 27/3241; H01L 27/1214;
(Continued)

(56) References Cited

U.S. PATENT DOCUMENTS

2003/0027369 A1   2/2003   Yamazaki
2005/0005848 A1*  1/2005   Yamazaki ............... C23C 14/12
                                                        118/719
(Continued)

FOREIGN PATENT DOCUMENTS

JP   2003-86359 A   3/2003
JP   2011-71023 A   4/2011

*Primary Examiner* — Kevin Quarterman
(74) *Attorney, Agent, or Firm* — ScienBiziP, P.C.

(57) ABSTRACT

An organic EL display 1 includes a sealing film 2 provided on a plastic substrate 10 to cover an organic EL element 4. The sealing film 2 includes a first sealing layer 25 on a surface of the plastic substrate 10, three stress relief layers 26, 27, and 28 on a surface of the first sealing layer 25, and a second sealing layer 29 on a surface of the stress relief layer 28. The stress relief layers 26, 27, and 28 each have a higher coefficient of thermal expansion than the first and second sealing layers 25 and 29. The stress relief layer 27 interposed between the stress relief layers 26 and 28 has a higher coefficient of thermal expansion than the stress relief layers 26 and 28.

13 Claims, 6 Drawing Sheets

(51) Int. Cl.
*H01L 27/12* (2006.01)
*H01L 27/32* (2006.01)
*H01L 51/56* (2006.01)
*H05B 33/06* (2006.01)

(52) U.S. Cl.
CPC ...... *H01L 27/3241* (2013.01); *H01L 51/5259* (2013.01); *H01L 51/56* (2013.01); *H05B 33/04* (2013.01); *H05B 33/06* (2013.01); *H01L 2251/566* (2013.01)

(58) Field of Classification Search
CPC .......... H01L 51/5259; H01L 2251/566; H05B 33/06; H05B 33/04
See application file for complete search history.

(56) References Cited

U.S. PATENT DOCUMENTS

| | | |
|---|---|---|
| 2005/0088088 A1 | 4/2005 | Yamazaki |
| 2006/0088951 A1* | 4/2006 | Hayashi .............. H01L 51/5237 438/99 |
| 2006/0220551 A1 | 10/2006 | Yamazaki |
| 2009/0115321 A1* | 5/2009 | Hayashi .............. H01L 51/5246 313/504 |
| 2010/0253215 A1* | 10/2010 | Fukagawa ........... H01L 51/5234 313/504 |
| 2015/0214504 A1* | 7/2015 | Sonoda .............. H01L 51/5256 257/40 |

* cited by examiner

ORGANIC EL DISPLAY DEVICE

TECHNICAL FIELD

The present invention relates to an organic EL display (device) including an organic electroluminescence element (hereinafter referred to as an "organic EL element").

BACKGROUND ART

In recent years, liquid crystal displays are often used as flat panel displays in various fields. However, contrast and shade greatly vary depending on viewing angles. A need for a light source such as a backlight hinders lower power consumption. Reduction in the thickness and weight of a liquid crystal display is limited. These serious problems still remain. Liquid crystal displays have serious problems also in flexibility.

To address the problems, self-luminous organic EL displays including organic EL elements are expected in place of liquid crystal displays. In an organic EL element, a current flows through organic EL layers sandwiched between an anode and a cathode so that organic molecules forming the organic EL layers emit light. Organic EL displays including such an organic EL element, which are self-luminous, have their thickness and weight easily reduced, and consume less power. The organic EL displays, which have a wide viewing angle, receive great attention as flat panels that have an advantage over liquid crystal panels.

Organic EL displays including a plastic substrate draw special attention. The plastic substrate has higher flexibility, higher shock resistance, and lower weight than a glass substrate. Such a plastic substrate would provide new organic EL displays beyond typical displays including a glass substrate.

However, in general, after a certain period of drive, light-emitting characteristics, such as brightness and uniformity in light emission, of an organic EL clement deteriorate significantly from the initial state. The deterioration in the light-emitting characteristics attributes to deterioration of an organic layer due to moisture of outside air, which has entered the organic EL element, or separation of the organic layer from an electrode due to moisture.

To address the problems, a technique in which a sealing film is provided to reduce entry of gas generated by moisture is disclosed. More specifically, for example, an organic EL display including a flexible plastic substrate (a film substrate) and a sealing film is disclosed. The sealing film is provided on the plastic substrate, and includes a stress relief layer and an inorganic layer, which are stacked one over the other. Such a configuration may reduce the deterioration of the organic EL display due to moisture and gas, and may improve the reliability of the organic EL display (see, for example, Patent Document 1).

CITATION LIST

Patent Document

Patent Document 1: Japanese Unexamined Patent Publication No. 2011-71023

SUMMARY OF THE INVENTION

Technical Problem

However, in the configuration described in Patent Document 1 described above, the stress relief layer and the inorganic layer have different coefficients of thermal expansion. Thus, while the sealing film is formed, a crack is developed in the inorganic layer due to the difference in coefficient of thermal expansion between the stress relief layer and the inorganic layer. The difference in coefficient of thermal expansion reduces the adhesion between the stress relief layer and the inorganic layer. This causes the inorganic layer to be separated from the stress relief layer. As a result, the organic EL display has reduced barrier properties against moisture.

In view of the foregoing problems, it is therefore an object of the present invention to provide an organic EL display which includes a sealing film, a stress relief layer, and an organic EL element, and which may reduce development of cracks in the sealing film, increase the adhesion between the stress relief layer and the sealing film, and reduce deterioration of the organic EL element.

Solution to the Problem

In order to achieve the object, an organic EL display according to the present invention includes: a flexible plastic substrate; an organic EL element on the plastic substrate; and a sealing film over the plastic substrate, the sealing film covering the organic EL element. The sealing film includes a first sealing layer on a surface of the plastic substrate, three or more stress relief layers on a surface of the first sealing layer, and a second sealing layer on a surface of the stress relief layer. The stress relief layers each have a higher coefficient of thermal expansion than the first and second sealing layers. One of the stress relief layers interposed between another one of the stress relief layers in contact with the first sealing layer and still another one of the stress relief layers in contact with the second sealing layer has a higher coefficient of thermal expansion than the another stress relief layer in contact with the first sealing layer and the still another stress relief layer in contact with the second sealing layer.

Advantages of the Invention

According to the present invention, a sealing film has improved barrier properties against moisture to reduce the deterioration of an organic EL element.

DESCRIPTION OF EMBODIMENTS

Embodiments of the present invention will now be described in detail with reference to the drawings. The present invention is not limited to the following embodiments.

(First Embodiment)

Figure 1:
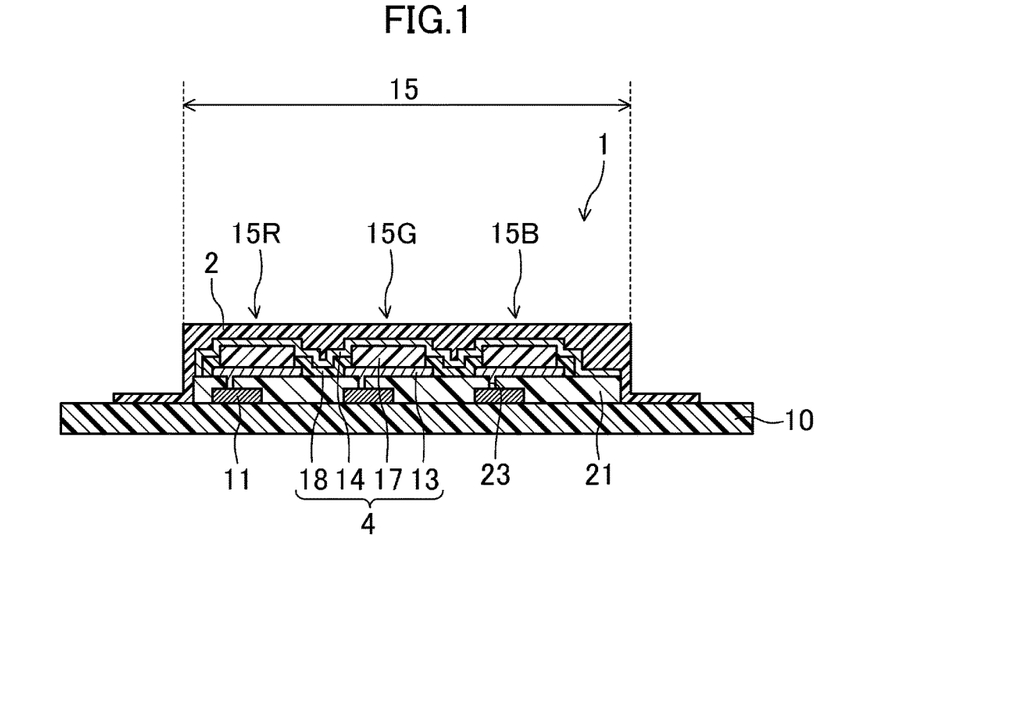
FIG. 1 is a cross-sectional view of an organic EL display according to a first embodiment of the present invention.
Figure 2:
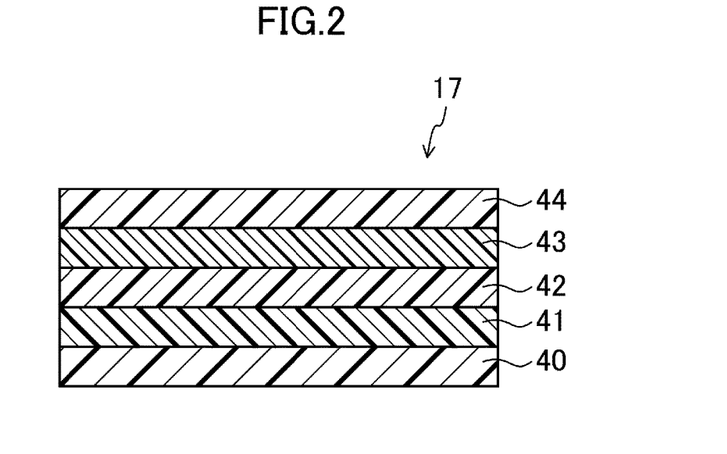
FIG. 2 is a cross-sectional view illustrating an organic EL layer forming an organic EL element included in the organic EL display according to the first embodiment of the present invention.

FIG. 1 is a cross-sectional view of an organic EL display according to a first embodiment of the present invention. FIG. 2 is a cross-sectional view illustrating an organic EL layer forming an organic EL element included in the organic EL display according to the first embodiment of the present invention.

As shown in FIG. 1, an organic EL display 1 includes a plastic substrate 10 being an element substrate, and organic EL elements 4 above the plastic substrate 10.

The plastic substrate 10 is a flexible film-like substrate made of an insulating resin material. The resin material forming the plastic substrate 10 may be, for example, an organic material such as polyimide resin and acrylic resin.

As shown in FIG. 1, the organic EL display 1 includes a display region 15 in which the organic EL elements 4 are placed. In this display region 15, the organic EL elements 4 are arranged in a matrix above the plastic substrate 10. This display region 15 is formed by arranging display regions 15R emitting red light, display regions 15G emitting green light, and display regions 15B emitting blue light in a predetermined pattern.

As shown in FIG. 1, each organic EL element 4 includes, above the plastic substrate 10, a predetermined array (e.g., a matrix) of first electrodes (anodes) 13, organic EL layers 17 on the respective first electrodes 13, and second electrodes 14 on the respective organic EL layers 17.

The organic EL element 4 also includes edge covers 18 to cover the peripheral edges of the first electrodes 13 and regions without the first electrodes 13. Each edge cover 18 is interposed between a pair of the pixel regions 15R, 15G, and 15B, and functions as a partition segmenting the pixel regions 15R, 15G, and 15B.

As shown in FIG. 1, the organic EL display 1 includes TFTs 11 and an interlayer insulating film 21. Each TFT 11 is formed on the plastic substrate 10 and electrically connected to one of the first electrodes 13 arranged in the predetermined array. The interlayer insulating film 21 is formed on the plastic substrate 10 to cover the TFTs 11.

The first electrodes 13 function to inject holes into the organic EL layers 17. The first electrodes 13 beneficially contain a material with a high work function. This is because a material with a high work function allows the first electrodes 13 to inject holes to the organic EL layers 17 with higher efficiency. Furthermore, as shown in FIG. 1, the first electrodes 13 are formed above the interlayer insulating film 21.

Examples of the material of the first electrodes 13 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The first electrodes 13 may also be an alloy of, for example, magnesium (Mg)/copper (Cu), magnesium (Mg)/silver (Ag), sodium (Na)/potassium (K), astatine (At)/astatine dioxide (AtO$_2$), lithium (Li)/aluminum (Al), lithium (Li)/calcium (Ca)/aluminum (Al), or lithium, fluoride (LiF)/calcium (Ca)/aluminum (Al). The first electrodes 13 may also be a conductive oxide such as tin oxide (SnO), zinc oxide (ZnO), indium, tin oxide (ITO), and indium zinc oxide (IZO).

Moreover, the first electrodes 13 may be multilayers containing the above materials. Examples of materials with a high work function include indium tin oxide (ITO) and indium zinc oxide (IZO).

The interlayer insulating film 21 is formed on the plastic substrate 10, and functions to flatten the surface of a film on which the TFTs 11 are provided. Due to this interlayer insulating film 21, the first electrodes 13 and the organic EL layers 17 are formed flat on or above the interlayer insulating film 21. That is, the planarization using the interlayer insulating film 21 reduces the risk that steps, protrusions, and recesses of the underlayers in the organic EL display 1 influence the shape of the surface of the first electrodes 13, causing light emission by the organic EL layer 17 to be non-uniform. The interlayer insulating film 21 contains a highly transparent, low-cost organic resin material such as acrylic resin.

As shown in FIG. 1, the first electrodes 13 are electrically connected to the TFTs 11 via contact holes 23 formed in the interlayer insulating film 21.

Each organic EL layer 17 is formed on a surface of a corresponding one of the first electrodes 13 arranged in a matrix. As shown in FIG. 2, each organic EL layer 17 includes a hole injection layer 40, a hole transport layer 41, a light-emitting layer 42, an electron transport layer 43, and an electron injection layer 44. The hole transport layer 41 is formed on the surface of the hole injection layer 40. The light-emitting layer 42 is formed on the surface of the hole transport layer 41, and emits either red, green, or blue light. The electron transport layer 43 is formed on the surface of the light-emitting layer 42. The electron injection layer 44 is formed on the surface of the electron transport layer 43. Each organic EL layer 17 is formed by sequentially stacking the hole injection layer 40, the hole transport layer 41, the light-emitting layer 42, the electron transport layer 43, and the electron injection layer 44. The organic EL layer 17 may be smaller in area than the underlying first electrodes 13 or larger in area than the underlying first electrodes 13 to cover the first electrodes 13.

The hole injection layer 40 is also called an anode buffer layer, which causes the energy levels of the first electrodes 13 and the organic EL layers 17 to approach each other to increase the efficiency of the first electrodes 13 injecting the holes to the organic EL layers 17.

Examples of the material of the hole injection layer 40 include triazole derivatives, oxadiazole derivatives, imidazole derivatives, polyarylalkane derivatives, pyraxoline derivatives, phenylenediamine derivatives, oxazole derivatives, styrylanthracene derivatives, fluorenone derivatives, hydrazine derivatives, and stilbene derivatives.

The hole transport layer 41 increases the efficiency in transporting holes from the first electrodes 13 to the organic EL layers 17. Examples of the material of the hole transport layer 41 include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazine derivatives, stilbene derivatives, hydrogenated amorphous silicon, hydrogenated amorphous silicon carbide, zinc sulfide, and zinc selenide.

When a voltage is applied from the first electrodes 13 and the second electrodes 14, holes and electrons are injected from both the electrodes to the light-emitting layer 42, in which the holes and the electrons are recombined with each other. This light-emitting layer 42 is made of a material with high luminous efficiency. Examples of the material include metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rodamine derivatives, acridine derivatives, phenoxazine, quinacridone derivatives, rubrene, poly-p-phenylene vinylene, and polysilane.

The electron transport layer 43 functions to efficiently move electrons to the light-emitting layer. Examples of the material of the electron transport layer 43 include, as organic compounds, oxadiaxole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, and metal oxinoid compounds.

The electron injection layer 44 causes the energy levels of the second electrode 14 and the organic EL layers 17 to approach each other to increase the efficiency in injecting electrons from the second electrode 14 into the organic EL layers 17, thereby reducing the drive voltage of the organic EL element 4. The electron injection layer may also be called a cathode buffer layer. Examples of the material of the electron injection layer 44 include inorganic alkaline compounds such as lithium fluoride (LiF), magnesium fluoride ($MgF_2$), calcium fluoride ($CaF_2$), strontium fluoride ($SrF_2$), barium fluoride ($BaF_2$), $Al_2O_3$, and SrO.

The second electrode 14 functions to inject electrons into the organic EL layer 17. The second electrode 14 may beneficially contain a material with a low work function. This is because a material with a low work function allows the second electrode 14 to inject electrons into the organic EL layer 17 with higher efficiency. As shown in FIG. 1, the second electrode 14 is formed above the organic EL layer 17.

Examples of materials of the second electrode 14 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 14 may also be an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 14 may also contain a conductive oxide such as tin oxide (SnO), zinc oxide (ZnO), or indium tin oxide (ITO) and indium zinc oxide (IZO). The second electrode 14 may be a multilayer containing the above materials.

A material with a tow work function may be, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), or lithium fluoride (LiF)/calcium (Ca)/aluminum (Al).

The edge covers 18 function to reduce short-circuit between the first electrodes 13 and the second electrode 14. Thus, the edge covers 18 beneficially cover entire peripheral edges of the first electrodes 13.

Examples of the material of the edge covers 18 include silicon dioxide ($SiO_2$), silicon nitride ($SiN_x$, where x is a positive number) such as $Si_3N_4$, and silicon oxynitride (SiNO).

As shown in FIG. 1, the organic EL display 1 also includes a sealing film 2. This sealing film 2 protects the organic EL element 4 from moisture. As shown in FIG. 1, the sealing film 2 is provided above the plastic substrate 10 to cover the organic EL elements 4.

Figure 3:
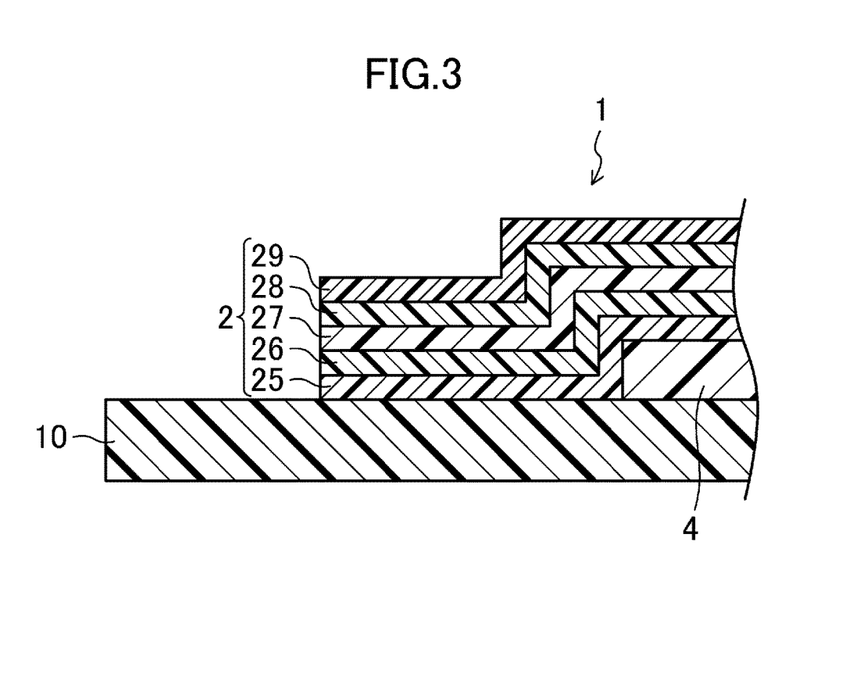
FIG. 3 is a cross-sectional view illustrating a configuration of a sealing film included in the organic EL display according to the first embodiment of the present invention.

In this embodiment, as shown in FIG. 3, the sealing film 2 is provided on the surface of the plastic substrate 10. The sealing film 2 is a multilayer including a first sealing layer 25 in contact with the plastic substrate 10, three stress relief layers 26, 27, and 28 on the surface of the first sealing layer 25, and a second sealing layer 29 on the sort ace of the stress relief layer 28.

The three stress relief layers 26, 27, and 28 include the stress relief layer 26 on the surface of the first sealing layer 25, the stress relief layer 27 on the surface of the stress relief layer 26, and the stress relief layer 28 on the surface of the stress relief layer 27.

In this embodiment, the sealing film 2 is designed such that the stress relief layers 26, 27, and 28 each have a higher coefficient of thermal expansion than each of the first and second sealing layers 25 and 29, and the stress relief layer 27 interposed between the stress relief layer 26 in contact with the first sealing layer 25 and the stress relief layer 28 in contact with the second sealing layer 29 has a higher coefficient of thermal, expansion than each of the stress relief layers 26 and 28 (i.e., "the coefficient of thermal expansion of the stress relief layer 27>the coefficient of thermal expansion of each of the stress relief layers 26 and 28>the coefficient of thermal expansion of each of the first and second sealing layers 25 and 29").

The "coefficient of thermal expansion" as used herein means how much the length and volume of an object increase by (thermal) expansion of the object in response to an increase in temperature (per 1° C.), and indicates the coefficient of linear expansion in an in-plane direction of a film. The coefficient of thermal expansion may be measured using, for example, a thin film stress measurement system (Product Name: FLX series, made by Toho Technology Inc.).

Such a configuration allows each of the stress relief layer 26 in contact with the first sealing layer 25 and the stress relief layer 28 in contact with the second sealing layer 29 to have a lower coefficient of thermal expansion than the stress relief layer 27 interposed between the stress relief layers 26 and 28. This may reduce residual stresses (residual stresses at the interface between the stress relief layers 26 and 27 and at the interlace between the stress relief layers 27 and 28) X arising from the difference in coefficient of thermal expansion among these layers shown in FIG. 4. This may increase the adhesion of the first sealing layer 25 to the stress relief layer 26 and the adhesion of the second sealing layer 29 to the stress relief layer 28, and may reduce development of cracks in the first and second sealing layers 25 and 29 while the sealing film 2 is formed. Thus, the first and second sealing layers 25 and 29 have improved barrier properties against moisture to reduce the deterioration of the organic EL element 4.

Figure 4:
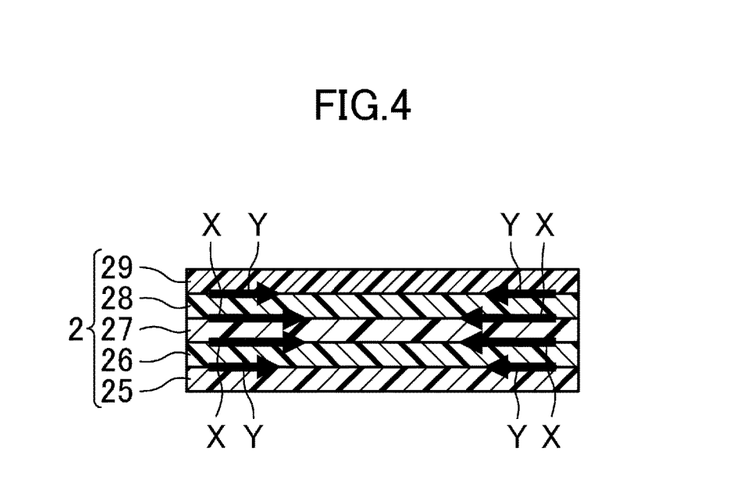
FIG. 4 is a schematic diagram for explaining residual stress of the sealing film included in the organic EL display according to the first embodiment of the present invention.

In this embodiment, the stress relief layers 26, 27, and 28 each have a higher coefficient of thermal expansion than the first and second sealing layers 25 and 29, and the stress relief layer 27 interposed between the stress relief layers 26 and 28 has a higher coefficient of thermal expansion than the stress relief layers 26 and 28. Thus, an increase in residual stress increases the moisture proofness. In addition, while the sealing film 2 is formed, residual stresses Y at the interface between the first sealing layer 25 and the stress relief layer 26 and at the interface between the stress relief layer 28 and the second sealing layer 29, shown in FIG. 4, are reduced. This may reduce development of cracks and improve the moisture proofness without allowing separation of the first and second sealing layers 25 and 29 while the sealing film 2 is formed.

In this embodiment, the difference in coefficient of thermal expansion between the first sealing layer 25 and the stress relief layer 26 and the difference in coefficient of thermal expansion between the second sealing layer 29 and the stress relief layer 28 is set to be less than or equal to 1.3 ppm/° C. This may reduce the residual stresses Y, and may reduce separation of films and development of cracks.

The difference in coefficient of thermal expansion between the stress relief layers 26 and 27 and the difference in coefficient of thermal expansion between the stress relief layers 28 and 27 are set to be less than or equal to 1.7 ppm/° C. Thus, the residual stresses X may improve the moisture proofness while separation of films and development of cracks are reduced.

Examples of the materials of the first and second sealing layers 25 and 29 include, but not specifically limited to, inorganic materials such as silicon dioxide ($SiO_2$), aluminum oxide ($Al_2O_3$) silicon nitride ($SiN_x$, where x is a positive number) such as $Si_3N_4$ and silicon carbonitride (SiCN).

Examples of the materials of the stress relief layers 26, 27, and 28 include organic materials such as polysiloxane, silicon oxycarbide (SiOC), acrylate, polyurea, parylene, polyimide, and polyamide.

In order to allow the organic EL element 4 to have sufficient durability, the sealing film 2 beneficially has a thickness within the range from 1 to 100 μm.

An exemplary method of manufacturing an organic EL display according to this embodiment will now be described. FIGS. 5 to 8 are cross-sectional views illustrating a method of manufacturing an organic EL display according to an embodiment of the present invention.

Figure 5:
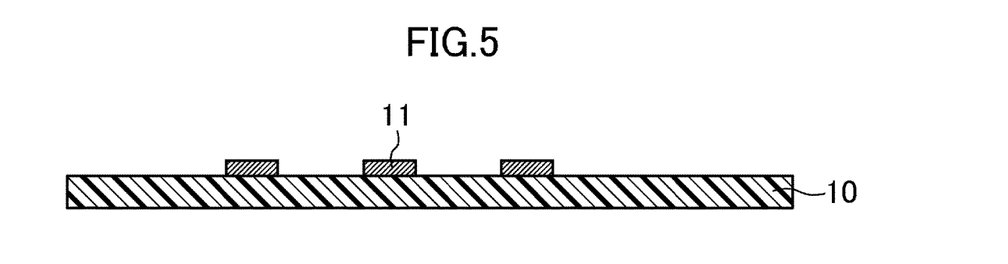
FIG. 5 is a cross-sectional view illustrating a method of manufacturing the organic EL display according to the first embodiment of the present invention.

First, as shown in FIG. 5, the TFTs 11 for driving the organic EL element 4 are formed at predetermined intervals on the plastic substrate 10 in a size of 320×400 mm and with a thickness of 0.7 mm, for example.

Figure 6:
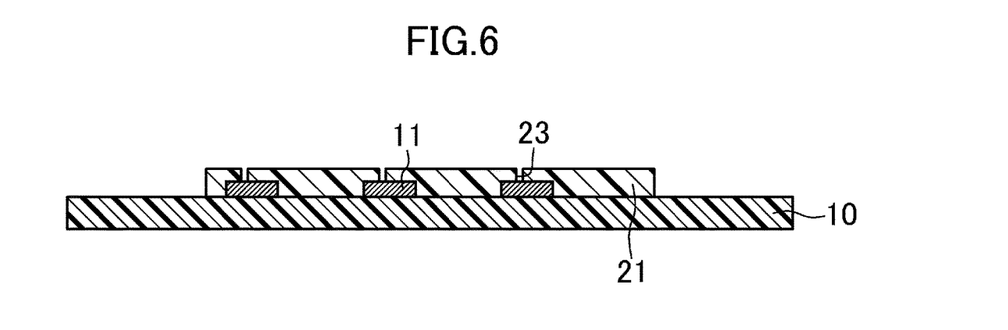
FIG. 6 is a cross-sectional view illustrating the method of manufacturing the organic EL display according to the first embodiment of the present invention.

Next, as shown in FIG. 6, a photosensitive acrylic resin is applied onto the plastic substrate 10 including the TFTs 11 by spin coating, and is exposed to a predetermined amount (e.g., 150 mJ/cm$^2$) of light through an exposure mask with a predetermined exposure pattern. Then, development is performed using an alkaline developer. As a result the interlayer insulating film 21 with a thickness of for example, 2 μm is formed. After the developments, the interlayer insulating film 21 is baked in post-baking under a predetermined condition (e.g., at a temperature of 220° C. for 60 minutes).

At this time, the contact holes 23 (with a diameter of, for example, 5 μm) for electrically connecting the first electrodes 13 to the TFTs 11 are formed in the interlayer insulating film 21.

Figure 7:
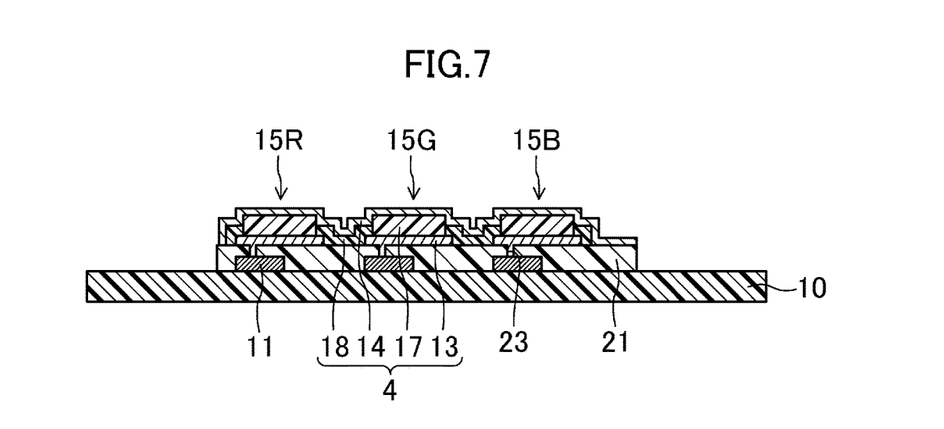
FIG. 7 is a cross-sectional view illustrating the method of manufacturing the organic EL display according to the first embodiment of the present invention.

As shown in FIG. 7, an ITO film is formed by sputtering, exposed to light by photolithography and developed, and patterned by etching to form the first electrodes 13 on the interlayer insulating film 21. At this time, the first electrodes 13 are formed to have a thickness of approximately 100 nm, for example. After the development, the first electrodes 13 are baked in post-baking under a predetermined condition (e.g., at a temperature of 220° C. for 120 minutes). The first electrodes 13 are electrically connected to the TFTs 11 via the contact holes 23 formed in the interlayer insulating film 21.

As shown in FIG. 7, a silicon dioxide film is formed at the peripheral edges of the first electrodes 13 by sputtering, exposed to light by photolithography and developed, and patterned by etching to form the edge covers 18 to cover the entire peripheral edges of the first electrodes 13. At this time, the edge covers 18 are formed to have a thickness of about 150 nm, for example.

Then, the organic EL layers 17 including the light-emitting layer 42 are formed on the first electrodes 13, and after that the second electrodes 14 are formed on the organic EL layers 17. The organic EL layers 17 and the second electrodes 14 are formed by vapor deposition, using a metal mask.

More specifically, first, the plastic substrate 10 including the first electrodes 13 as shown in FIG. 7 is placed in a chamber of a vapor deposition system. The inside of the chamber of the vapor deposition system is kept at a vacuum degree of $1\times10^{-5}$ to $1\times10^{-4}$ Pa by a vacuum pump. The plastic substrate 10 including the first electrodes 13 is placed with two sides fixed to a pair of substrate receivers attached to the inside of the chamber.

In an evaporation source, source materials (evaporants) of the hole injection layer 40, the hole transport layer 41, the light-emitting layer 42, the electron transport layer 43, and the electron injection layer 44 evaporate. Then, these layers are stacked to form the organic EL layers 17 in pixel regions as shown in FIG. 7.

Next, as shown in FIG. 7, the second electrodes 14 are formed on the organic EL layers 17. As a result, the organic EL elements 4 including the first electrodes 13, the organic EL layers 17, the second electrodes 14, and the edge covers 18 are formed on or above the plastic substrate 10.

Note, for example, that a crucible containing the evaporants is used as the evaporation source. The crucible is placed at a lower position inside the chamber, and includes a heater, which heats the crucible.

The heat of the heater allows the temperature inside the crucible to reach the evaporation temperatures of the evaporants so that the evaporants inside the crucible turn to vapor and the vapor jumps out upward inside the chamber.

A specific example method of forming the organic EL layers 17 and the second electrodes 14 is as follows. First, on the first electrodes 13, which are patterned on the plastic substrate 10, the hole injection layer 40 made of m-MT-DATA(4,4,4-tris(3-methylphenylphenylamino)triphenylamine) is formed with a thickness of, for example, 25 nm in common among all of RGB pixels, via a mask.

Then, on the hole injection layer 40, the hole transport layer 41 made of α-NPD(4,4-bis(N-1-naphthyl-N-phenylamino)biphenyl) is formed with a thickness of, for example, 30 nm in common among all RGB pixels via a mask.

Next, the light-emitting layer 42 of the red color is formed with a thickness of, for example, 30 nm on the hole transport layer 41 in the associated pixel regions via a mask. The light-emitting layer 42 of the red color is made of a mixture containing di(2-naphthyl)anthracene (ADN) and 30 wt % of 2,6-bis((4'-methoxydiphenylamino)styryl)-1,5-dicyanonaphthalene (BSN).

After that, the light-emitting layer 42 of the green color is formed with a thickness of, for example, 30 nm on the hole transport layer 41 in the associated pixel regions via a mask. The light-emitting layer 42 of the green color is made of a mixture containing of ADN and 5 wt % of coumarin 6.

Then, the light-emitting layer 42 of the blue color is formed with a thickness of, for example, 30 nm on the hole transport layer 41 in the associated pixel regions via a mask. The light-emitting layer 42 of the blue color is made of a mixture containing ADN and 2.5 wt % of 4,4'-bis(2-{4-(N,N-diphenylamino)phenyl}vinyl)biphenyl(DPAVBi) into ADN.

Next, 8-hydroxyquinoline aluminum (Alq3) is formed, as the electron transport layer 43, with a thickness of for example, 20 nm in common among all the RGB pixels on the light-emitting layer 42 of all the colors via a mask.

After that, lithium fluoride (LiF) is formed, as the electron injection layer 44, with a thickness of, for example, 0.3 nm on the electron transport layer 43 via a mask.

Then, the second electrodes 14 made of aluminum (Al) are formed with a thickness of, for example, 10 nm by vacuum vapor deposition.

Figure 8:
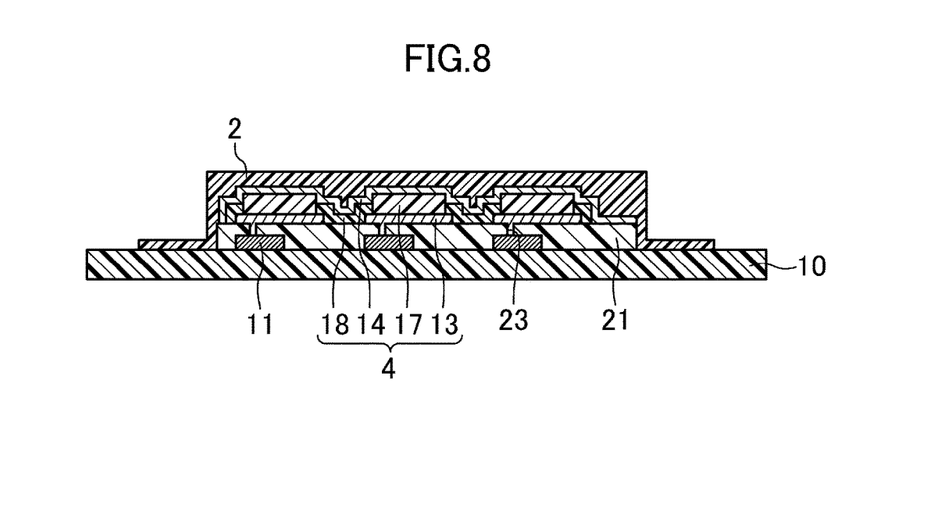
FIG. 8 is a cross-sectional view illustrating the method of manufacturing the organic EL display according to the first embodiment of the present invention.

After that, as shown in FIG. 8, the sealing film 2 is formed on the plastic substrate 10 to cover the organic EL element 4. More specifically, first, an inorganic material such as silicon dioxide ($SiO_2$) or aluminum oxide ($Al_2O_3$) is stacked on the surfaces of the plastic substrate 10 and the organic EL element 4 by plasma CVD, vacuum vapor deposition, sputtering, atomic layer deposition (ALD) or other methods to form the first sealing layer 25.

Next, organic materials such as acrylate, polyurea, parylene, polyimide, and polyamide are stacked on the surface of the first sealing layer 25 by vacuum vapor deposition to sequentially form the stress relief layers 26, 27, and 28.

Like the first sealing layer 25 described above, an inorganic material such as silicon dioxide ($SiO_2$) aluminum oxide ($Al_2O_3$) is stacked on the surface of the stress relief layer 28 by plasma CVD, vacuum vapor deposition, sputtering, and atomic layer deposition (ALD) to form the second sealing layer 27. As a result, the sealing film 2 including the first sealing layer 25, the stress relief layers 26, 27, and 28, and the second sealing layer formed.

In the foregoing manner, the organic EL display of this embodiment may be manufactured.

This embodiment described above provides the following advantages.
1. In this embodiment, the coefficient of thermal expansion of each of the stress relief layers 26, 27, and 28 is set to be higher than that of each of the first and second sealing layers 25 and 29. The coefficient of thermal expansion of the stress relief layer 27 interposed between the stress relief layers 26 and 28 is set to be higher than that of each of fixe stress relief layers 26 and 28. This may increase the adhesion of the first sealing layer 25 to the stress relief layer 26 and the adhesion of the second sealing layer 29 to the stress relief layer 28, because the stress relief layer 26 in contact with the first sealing layer 25 and the stress relief layer 28 in contact with the second sealing layer 29 each have a lower coefficient of thermal expansion than the stress relief layer 27 interposed between the stress relief layers 26 and 28. While the sealing film 2 is formed, development of cracks at the first and second sealing layers 25 and 29 may be reduced. Thus, the first and second sealing layers 25 and 29 have improved barrier properties against moisture to reduce the deterioration of the organic EL element 4.
2. In this embodiment, the coefficient of thermal expansion of each of the stress relief layers 26, 27, and 28 is set to be higher than that of each of the first and second sealing layers 25 and 29. The coefficient of thermal expansion of the stress relief layer 27 interposed between the stress relief layers 26 and 28 is set to be higher than that of each of the stress relief layers 26 and 28. This may reduce stresses on the first and second sealing layers 25 and 29 while the sealing film 2 is formed. This reduction may reduce development of cracks without allowing separation of the first and second sealing layers 25 and 29.
3. In this embodiment, the difference in coefficient of thermal expansion between the first sealing layer 25 and the stress relief layer 26 and the difference in coefficient of thermal expansion between the second sealing layer 29 and the stress relief layer 28 is set to be less than or equal to 1.3 ppm/° C. This may reduce the residual stresses, and may reduce separation of films and development of cracks.
4. In this embodiment, the difference in coefficient of thermal expansion between the stress relief layers 26 and 27 and the difference in coefficient of thermal expansion between the stress relief layer 28 and 27 is set to be less than or equal to 1.7 ppm/° C. This may improve the moisture proofness while reducing separation of films and development of cracks.
5. In this embodiment, the first sealing layer 25 is formed by plasma CVD. This configuration may further increase the adhesion of the first sealing layer 25 to the stress relief layer 26.
6. In this embodiment the second sealing layer 29 is formed by plasma CVD. When the sealing film 2 is formed, cracks at the second sealing layer 29 may be further reduced.
7. In this embodiment, the stress relief layers 26, 27, and 28 are formed by plasma CVD. This may further reduce development of cracks without allowing separation of the first and second sealing layers 25 and 29 while the sealing film 2 is formed.

(Second Embodiment)

Figure 9:
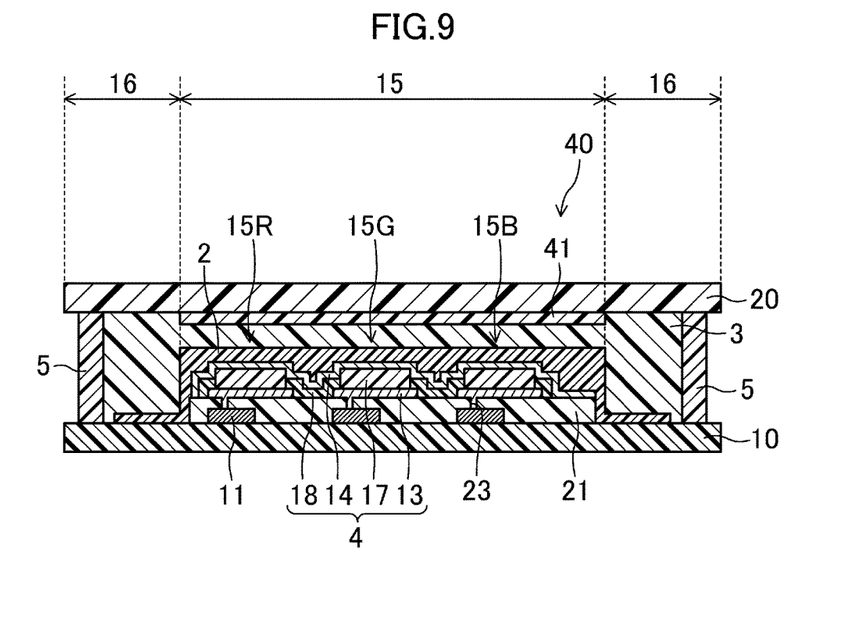
FIG. 9 is a cross-sectional view of an organic EL display according to a second embodiment of the present invention.

A second embodiment of the present invention will now be described. FIG. 9 is a cross-sectional view illustrating a configuration of a sealing film according to the second embodiment of the present invention. The same reference numerals as those in the first embodiment are used to represent equivalent elements, and the detailed explanation thereof will be omitted.

As shown in FIG. 9, in this embodiment, an organic EL display 40 includes a plastic substrate 20, which functions as a sealing substrate facing the plastic substrate 10. The organic EL element 4 formed on the plastic substrate 10 is interposed between the plastic substrates 10 and 20.

The organic EL display 40 includes a sealing material 5, which is interposed between the plastic substrates 10 and 20 and bonds the plastic substrates 10 and 20 together to encapsulate the organic EL element 4.

The sealing material 5 is formed in a frame around the organic BL element 4. The plastic substrates 10 and 20 are bonded together via the sealing material 5.

The plastic substrate 20 is a flexible film-like substrate made of an insulating resin material. The resin material forming the plastic substrate 20 may be, for example, an organic material such as polyimide resin and an acrylic resin.

The plastic substrate 20 includes a color filter 41 composed of layers colored in red, green, or blue, and black matrixes adjacent to the colored layers.

As shown in FIG. 9, the organic EL display 40 includes a display region 15 surrounded by the sealing material 5. In this display region 15, the organic EL elements 4 are arranged in a matrix above the plastic substrate 10, which faces the plastic substrate 20. As described above, this display region 15 is formed by arranging display regions 15R emitting red light, display regions 15G emitting green light, and display regions 15B emitting blue light in a predetermined pattern.

As shown in FIG. 9, the organic EL display 40 also includes a filler 3 functioning as a getter (functioning to adsorb oxygen or moisture). As shown in FIG. 9, the filler 3 is provided on the sealing film 2 to cover the sealing film 2.

Examples of the material of the filler 3 include epoxy resin (e.g., thermosetting one-part epoxy resin) and silicon resin. In view of improving adsorption of moisture, the filler 3 contains an alkaline earth metal oxide such as calcium oxide (CaO) and barium oxide (BaO) and a desiccant such as silica gel and zeolite.

The sealing material 5 bonds the plastic substrates 10 and 20 together and fixes the plastic substrates 10 and 20. Examples of the material of the sealing material 5 include epoxy resin, ultraviolet (UV) curable resin such as acrylic resin, and thermosetting resin.

As shown in FIG. 9, in the organic EL display 40, a picture-frame region (i.e., a seal formation region) 16 for the sealing material 5 is defined around the display region 15. As shown in FIG. 9, the sealing material 5 is provided in the picture-frame region 16 in a frame to encapsulate the organic EL element 4 and bonds the plastic substrates 10 and 20 together.

In manufacturing the organic EL display 40 of this embodiment, first, the color filter 41 is formed on the plastic substrate 20 in a size of 320×400 mm and with a thickness of 0.7 mm, for example.

More specifically, positive photosensitive resin which contains a black pigment such as carbon fine particles dispersed therein is applied onto the entire plastic substrate 20 by spin coating. After that, the applied photosensitive resin is exposed to light via a photomask, and then patterned by development and heating to form the black matrix with a thickness of, for example, 2.5 µm on the plastic substrate 20.

Then, for example, an acrylic photosensitive resin colored in red, green, or blue is applied onto the substrate with the black matrix. The applied photosensitive resin is exposed to light via a photomask, and then patterned by development to form a layer colored in the selected color (e.g., a red layer R) with a thickness of, for example, 2.5 µm. For the other two colors, similar steps are repeated. Layers colored in the other two colors (e.g., a green layer G and a blue layer B) with a thickness of, for example, 2.5 µm to form the color filter 41 including the colored layers (the red, green, and blue layers R, G, and B).

Next, the material such as the epoxy resin is applied onto the plastic substrate 20 with the color filter 41 by dispending, mask printing, screen printing, or other methods to form the sealing material 5 in a frame.

Spacers (not shown) are mixed into the sealing material 5 to control the distance between the plastic substrates 10 and 20. These spacers contain, for example, silicon dioxide ($SiO_2$).

After that, the material of the filler 3 is applied to the inside of the sealing material 5 on the plastic substrate 20 to be spaced apart from the sealing material 5 by dispending, mask printing, drop injection, or other methods. In place of the material to be applied, a sheet-like material may be used.

Next, in a vacuum atmosphere, the plastic substrate 20 with the sealing material 5 is stacked above the plastic substrate 10 with the organic EL element 4 and the sealing film 2 (see FIG. 1) so that the material of the filler 3 overlaps with the organic EL element 4. The surface of the sealing material 5 on the plastic substrate 20 is mounted on the surface of the plastic substrate 10 in the picture-frame region 16.

Then, under a predetermined condition (e.g., under a pressure of 100 Pa or lower), the inside of the sealing material 5 is kept in airtight vacuum. In a vacuum atmosphere, the plastic substrate 20 is moved toward the plastic substrate 10 and pressed to bond the plastic substrate 10 to the plastic substrate 20 via the sealing material 5. As a result, a bonded structure of the plastic substrates 10 and 20 is formed.

In bonding the plastic substrates 10 and 20 together, the pressure evenly diffuses the material of the filler 3, which is formed on the surface of the plastic substrate 20, inside the sealing material 5. As a result, the filler 3 is formed on the sealing film 2 to cover the sealing film 2.

Next, after purging the vacuum to the atmospheric pressure (i.e., returning the vacuum to the atmospheric pressure), the plastic substrate 20 is irradiated with ultraviolet (UV) light to cure the resin forming the sealing material 5. As a result, the organic EL display 40 shown in FIG. 9 is manufactured.

The embodiment described above provides the following advantage in addition to the advantages 1 to 7 described above.

8. In this embodiment, the sealing material 5 configured to encapsulate the organic EL element 4 and the filler 3 configured to cover the sealing film 2 are provided. Therefore, the sealing material 5 and the filler 3 block water and oxygen permeating from the outside into the sealing film 2 to reliably reduce the deterioration of the organic EL element 4.

The embodiments may be modified as follows.

In the embodiments, the three stress relief layers 26, 27, and 28 are provided on the surface of the first sealing layer 25. However, the number of stress relief layers herein is merely an example of the present invention. For example, four or more stress relief layers may be provided. That is to say, according to the present invention, providing three or more stress relief layers on the surface of the first sealing layer 25 provides the advantages 1 to 7 described in the first embodiment.

Figure 10:
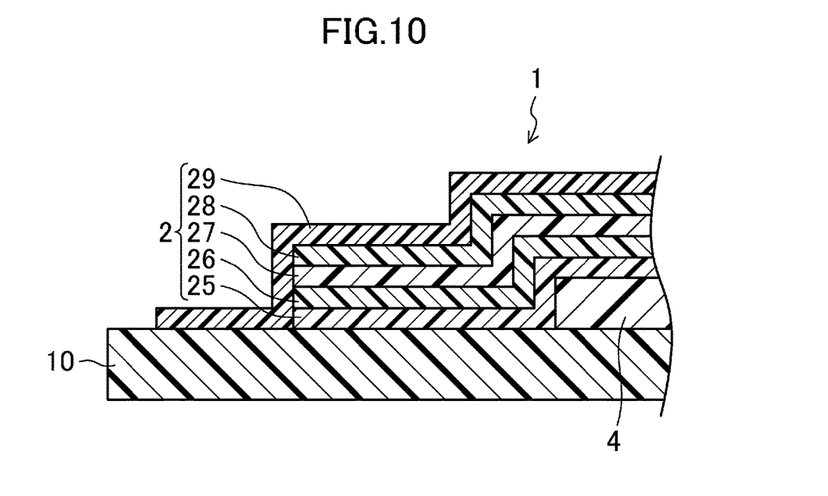
FIG. 10 is a cross-sectional view illustrating a configuration of a sealing film included in an organic EL display according to a variation of the present invention.

In the embodiments, the second sealing layer 29 may cover the first sealing layer 25 and the stress relief layers 26-28 as shown in FIG. 10. With this corporation, the sealing film 2 has greater barrier properties against moisture to further reliably reduce the deterioration of the organic EL element 4.

Figure 11:
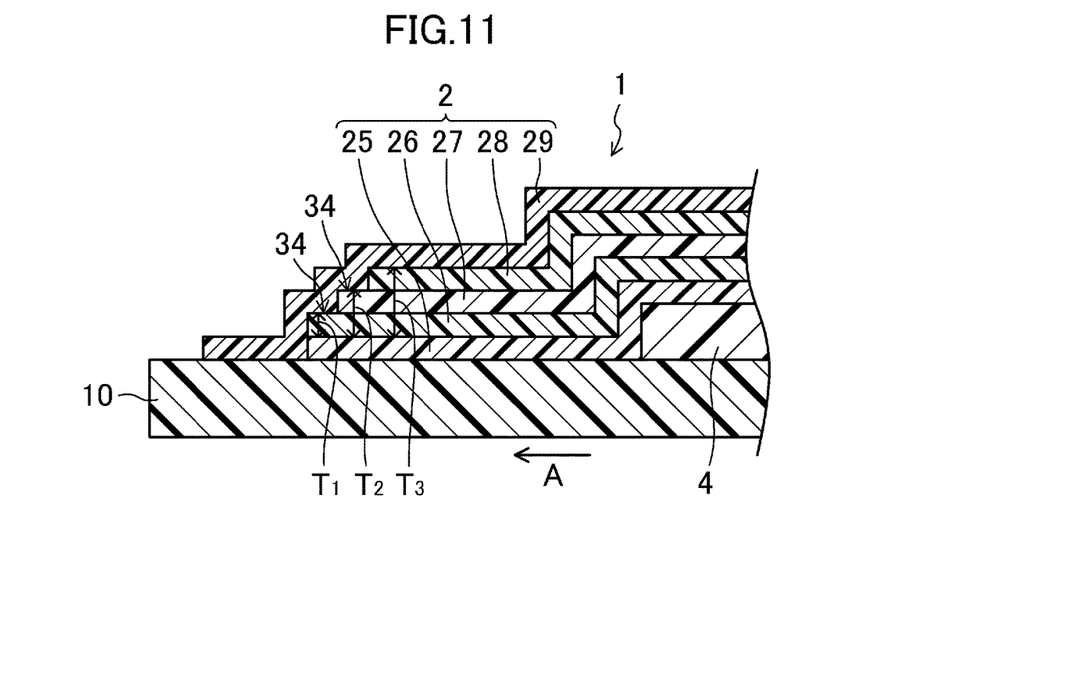
FIG. 11 is a cross-sectional view illustrating a configuration of a sealing film included in an organic EL display according to another variation of the present invention.

As shown in FIG. 11, the stress relief layers 26-28 may form steps, and the thickness of a combination of the stress relief layers 26-28 may decrease from the organic EL element 4 toward the periphery of the organic EL display 1 (i.e., in the direction indicated by the arrow A shown in FIG. 11). That is to say, the thicknesses $T_1$-$T_3$ shown in FIG. 11 may be designed to satisfy the expression "$T_1 < T_2 < T_3$." Such a configuration reduces the height of each step at an end of the combination of the stress relief layers 26-28. This improves the coverage of the second sealing layer 29 over the stress relief layers 26-28.

Figure 12:
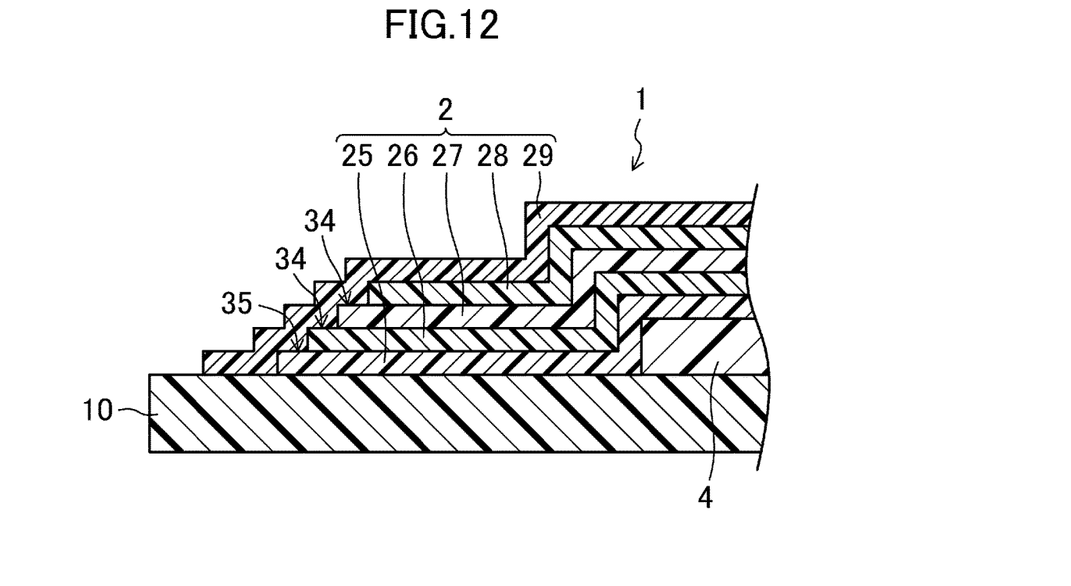
FIG. 12 is a cross-sectional view illustrating a configuration of a sealing film included in an organic EL display according to still another variation of the present invention.

Moreover, as shown in FIG. 12, the first sealing layer 25 and the stress relief layer 26 may form a step 35, and the second sealing layer 29 may cover the step 35. Such a configuration reduces the height of the step at an end of the combination of the first sealing layer 25 and the stress relief layer 26. This improves the coverage of the second sealing layer 29 over the first sealing layer 25 and the stress relief layer 26.

In the embodiments described above, each of the organic EL layers 17 has a multilayer structure of five layers of the hole injection layer 40, the hole transport layer 41, the light-emitting layer 42, the electron transport layer 43, and the electron injection layer 44. The multilayer structure is not limited to five layers. For example, the multilayer structure may include three layers of a hole injection and transport layer, a light-emitting layer, and an electron injection and transport layer.

The multilayer structure may be inverted so that the first electrodes 13 function as cathodes, and the second electrodes 14 function as anodes. In this case, the multilayer structure may include, from the bottom, the first electrodes 13 as cathodes, the electron injection layer 44, the electron transport layer 43, the light-emitting layer 42, the hole transport layer 41, the hole injection layer 40, and the second electrodes 14 as anodes. In this case, the material of the first electrodes 13 and the material of the second electrodes 14 are replaced with each other.

INDUSTRIAL APPLICABILITY

As can be seen from the foregoing description, the present invention is suitable for an organic EL display including an organic EL element.

DESCRIPTION OF REFERENCE CHARACTERS

1 Organic EL Display
2 Sealing Film
3 Filler
4 Organic EL Element
5 Sealing Material
10 Plastic Substrate
17 Organic EL Layer
20 Plastic Substrate (Another Plastic Substrate)
25 First Sealing Layer
26 Stress Relief Layer (First Stress Relief Layer)
27 Stress Relief Layer (Second Stress Relief Layer)
28 Stress Relief Layer (Third Stress Relief Layer)
29 Second Sealing Layer
34 Step
35 Step (Another Step)
40 Organic EL Display

The invention claimed is:

1. An organic EL display comprising:
a flexible plastic substrate;
an organic EL element on the plastic substrate; and
a sealing film over the plastic substrate, the sealing film covering the organic EL element, wherein
the sealing film includes a first sealing layer on a surface of the plastic substrate, three or more stress relief layers on a surface of the first sealing layer, and a second sealing layer on a surface of one of the stress relief layers,
the stress relief layers each have a higher coefficient of thermal expansion than the first and second sealing layers, and
one of the stress relief layers interposed between another one of the stress relief layers in contact with the first sealing layer and still another one of the stress relief layers in contact with the second sealing layer has a higher coefficient of thermal expansion than the another stress relief layer in contact with the first sealing layer and the still another stress relief layer in contact with the second sealing layer.

2. The organic EL display of claim 1, wherein
the stress relief layers are three layers including a first stress relief layer on the surface of the first sealing layer, a second stress relief layer on a surface of the first stress relief layer, and a third stress relief layer on a surface of the second stress relief layer, and
the second stress relief layer has a higher coefficient of thermal expansion than the first and third stress relief layers.

3. The organic EL display of claim 1, wherein
a difference in coefficient of thermal expansion between the first sealing layer and the another stress relief layer in contact with the first sealing layer is less than or equal to 1.3 ppm/° C., and
a difference in coefficient of thermal expansion between the second sealing layer and the still another stress relief layer in contact with the second sealing layer is less than or equal to 1.3 ppm/° C.

4. The organic EL display of claim 1, wherein
a difference in coefficient of thermal expansion between the another stress relief layer in contact with the first sealing layer and the stress relief layer interposed between the another stress relief layer in contact with the first sealing layer and the still another stress relief layer in contact with the second sealing layer is less than or equal to 1.7 ppm/° C., and
a difference in coefficient of thermal expansion between the still another stress relief layer in contact with the second sealing layer and the stress relief layer interposed between the another stress relief layer in contact with the first sealing layer and the still another stress relief layer in contact with the second sealing layer is less than or equal to 1.7 ppm/° C.

5. The organic EL display of claim 1, wherein the first sealing layer is formed by plasma CVD.

6. The organic EL display of claim 1, wherein the second sealing layer is formed by plasma CVD.

7. The organic EL display of claim 1, wherein the stress relief layers are formed by plasma CVD.

8. The organic EL display of claim 1, wherein the second sealing layer covers the first sealing layer and the stress relief layers.

9. The organic EL display of claim 8, wherein
the stress relief layers form a step, and a combination of the stress relief layers have a thickness that decreases from the organic EL element toward a periphery of the organic EL display.

10. The organic EL display of claim 8, wherein
the first sealing layer and the stress relief layers form another step, and the second sealing layer covers the another step.

11. The organic EL display of claim 1, further comprising:
another plastic substrate facing the plastic substrate;
a sealing material provided between the plastic substrate and the another plastic substrate and bonding the plastic substrate and the another plastic substrate together to encapsulate the organic EL element; and
a filler provided on the sealing film to cover the sealing film.

12. The organic EL display of claim 9, wherein
one of the stress relief layers being in contact with the first sealing layer has an end aligned with an end of the first sealing layer, and another one of the stress relief layers immediately above the one of the stress relief layers is closer to the organic EL element than the end of the first sealing layer is.

13. The organic EL display of claim 9, wherein
one of the stress relief layers being in contact with the first sealing layer has an end that is closer to the organic EL element than an end of the first sealing layer is.

* * * * *